United States Patent [19]

Okunaga

[11] Patent Number: 5,532,640
[45] Date of Patent: Jul. 2, 1996

[54] VOLTAGE GENERATOR CIRCUIT GENERATING STABLE NEGATIVE POTENTIAL

[75] Inventor: Kazuo Okunaga, Tokyo, Japan

[73] Assignee: NEC Corporation, Tokyo, Japan

[21] Appl. No.: 268,450

[22] Filed: Jun. 30, 1994

[30] Foreign Application Priority Data

Jun. 30, 1993 [JP] Japan .................................. 5-159805

[51] Int. Cl.⁶ ...................................................... G05F 1/10
[52] U.S. Cl. ........................... 327/537; 327/536; 327/543
[58] Field of Search ..................................... 327/331, 390, 327/535, 536, 537, 538, 540, 541, 543

[56] References Cited

U.S. PATENT DOCUMENTS

| | | | |
|---|---|---|---|
| 4,336,466 | 6/1982 | Sud et al. | |
| 4,581,546 | 4/1986 | Allan | 327/537 |
| 4,628,214 | 12/1986 | Leuschner | 327/536 |
| 4,633,106 | 12/1986 | Backes et al. | 327/537 |
| 4,733,108 | 5/1988 | Truong | 327/537 |
| 5,041,739 | 8/1991 | Goto | 327/537 |
| 5,172,013 | 12/1992 | Matsumara | 327/537 |
| 5,184,030 | 2/1993 | Chung et al. | 327/534 |
| 5,210,446 | 5/1993 | Niuya et al. | 327/537 |
| 5,342,799 | 8/1994 | Walker et al. | 327/536 |
| 5,347,171 | 9/1994 | Cordoba et al. | 327/537 |

FOREIGN PATENT DOCUMENTS 0051532  5/1982  European Pat. Off. .

Primary Examiner—Terry Cunningham
Attorney, Agent, or Firm—Sughrue, Mion, Zinn, Macpeak & Seas

[57] ABSTRACT

The voltage generator circuit according to the invention has a first negative potential generator circuit to generate a first clock signal going negative and oscillating at negative voltage in response to a first clock signal oscillating at positive voltage, a second negative potential generator circuit to generate, in response to a second clock signal oscillating at positive voltage, a second clock signal going negative and oscillating at negative voltage and having an amplitude greater than the amplitude voltage of the first clock signal going negative, and an output circuit to deliver the lowest voltage of the first clock signal in response to the second clock signal going negative.

6 Claims, 3 Drawing Sheets

VOLTAGE GENERATOR CIRCUIT GENERATING STABLE NEGATIVE POTENTIAL

BACKGROUND OF THE INVENTION

1. Field of the Invention

The present invention relates to a voltage generator circuit and, more particularly, to such a circuit generating and supplying a negative bias voltage to a substrate or well regions of a semiconductor memory device.

2. Description of the Prior Art

While a semiconductor device is supplied at its substrate and/or well region with a predetermined potential, in a dynamic random access memory (DRAM) device, a fixed negative potential is applied to the substrate or well regions thereof in which n-type MOS transistors are formed. This is because to reverse-bias a p-n junction formed between each of n-type source and drain regions of an n-type MOS transistors and the substrate or well regions. With the reverse-biased condition, the p-n junction has a smaller junction capacitance to thereby make each transistor operate at high speed. Thus, the DRAM device includes a voltage generator circuit generating and supplying the negative potential to the substrate or well regions.

The conventional negative voltage generator circuit consists of a low-potential signal generator circuit generating, in response to a clock signal oscillating between the supply potential (Vcc) and the ground potential (GND), a negative clock signal oscillating between GND and −Vcc, an output terminal connected to the substrate, and an output transistor consisting of a p-type MOS transistor with its source-drain path placed between the output terminal and the output terminal of the low-potential signal generator circuit. The output transistor turns on and off repeatedly in accordance with the negative clock signal applied to its gate, and the output terminal and accordingly the substrate are thus pulled down to a negative potential.

However, the output transistor is turned ON when applied at its gate with −Vcc level clock signal. For this reason, the output terminal (i.e., the substrate) is clamped at such a potential level that is higher than −Vcc level by the threshold level VTP of the output transistor, namely, −Vcc +|VTP|. For example, in the cases of Vcc being 3 volts and |VTP| being 1.5 volts, the voltage level of the output terminal, that is the substrate potential is clamped at −1.5 volts.

Such a small substrate bias voltage does not present the above-mentioned effects to the DRAM. Moreover, the small potential difference between the gate and source of the output transistor makes its driving oscillating small so that at takes long time to pull down the substrate to the predetermined potential.

BRIEF SUMMARY OF THE INVENTION

Object of the Invention

An object of the invention is therefore to provide an improved voltage generator circuit for a substrate or a well region of a semiconductor memory device.

Another object of the invention is to provide a voltage generator circuit having an output transistor driving a substrate or a well region with large drive capability.

Summary of the Invention

A voltage generator circuit according to the invention has a first negative potential generator circuit for generating a first negative clock signal oscillating at negative voltage in response to a first clock signal oscillating at positive voltage, a second negative potential generator circuit for generating, in response to a second clock signal oscillating at positive voltage, a second negative clock signal oscillating at negative voltage and having an amplitude greater than the magnitude of the amplitude voltage of the first clock signal going negative, and an output circuit to deliver the lowest voltage of the first clock signal in response to the second clock signal going negative.

In the voltage generator circuit according to the present invention, the highest voltages of the first and second clock signals are preferably a positive supply voltage and the lowest voltage of the first clock signal going negative is the value of the supply voltage inverted to negative.

The output circuit preferably has a p-type MOS transistor with its source-drain path connected between its output terminal and the output of the first negative potential generator circuit and with its gate supplied with the second clock signal going negative.

BRIEF DESCRIPTION OF THE DRAWINGS

This above-mentioned and other objects features and advantages of this invention will become more apparent by reference to the following detailed description of the invention taken in conjunction with the accompanying drawings, wherein.

DETAILED DESCRIPTION OF THE PREFERRED EMBODIMENTS

Figure 1:
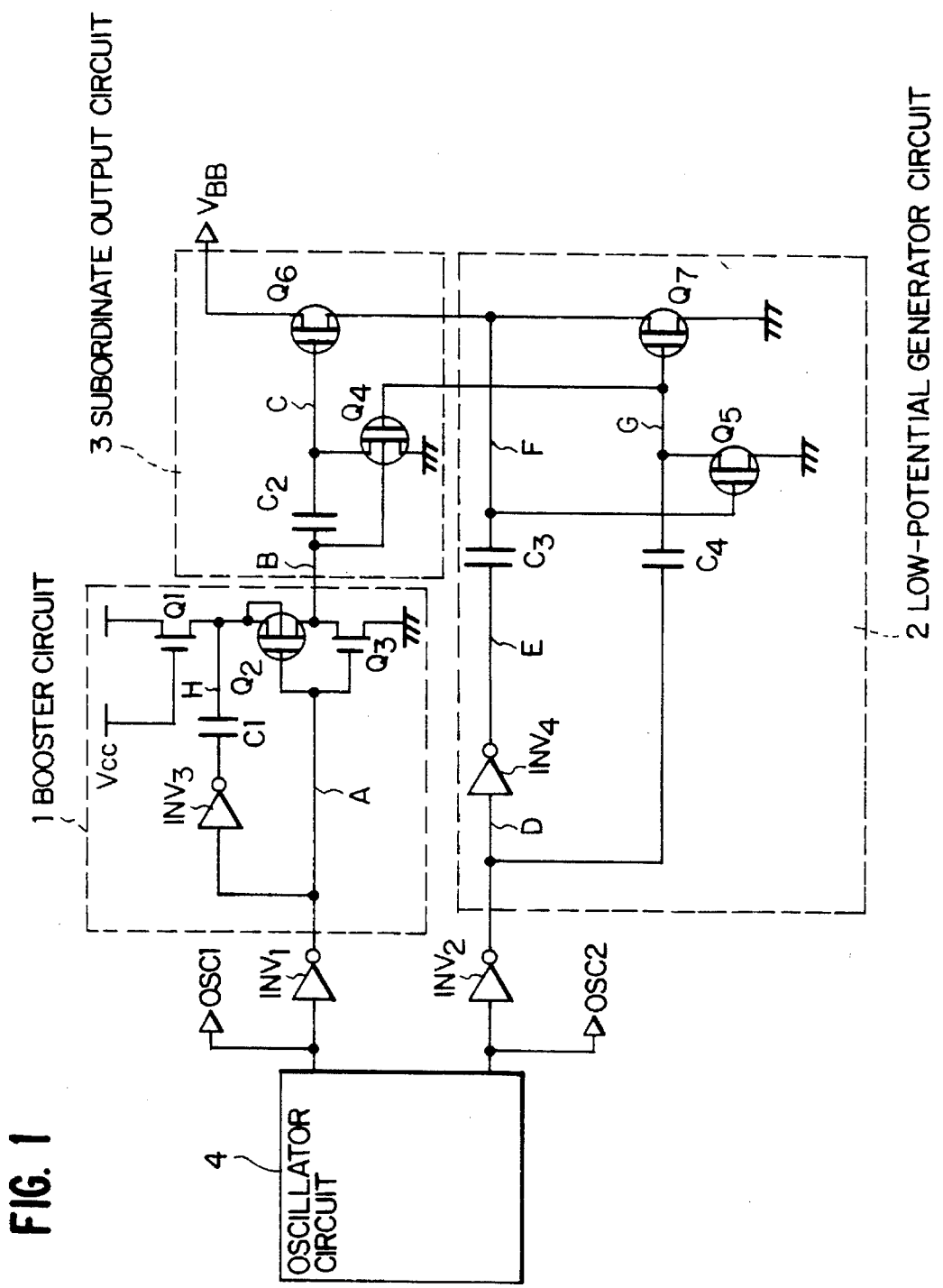
FIG. 1 is a circuit diagram of a voltage generator circuit according to a first embodiment of the present invention.

Referring to FIG. 1, the voltage generator circuit according to the first embodiment of the present invention includes an oscillator circuit 4 generating clock signals OSC1 and OSC2, a booster circuit 1, a low-potential generator circuit 2, and an output circuit 3 generating a bias voltage $V_{BB}$ to be supplied to a substrate (not shown).

Figure 2:
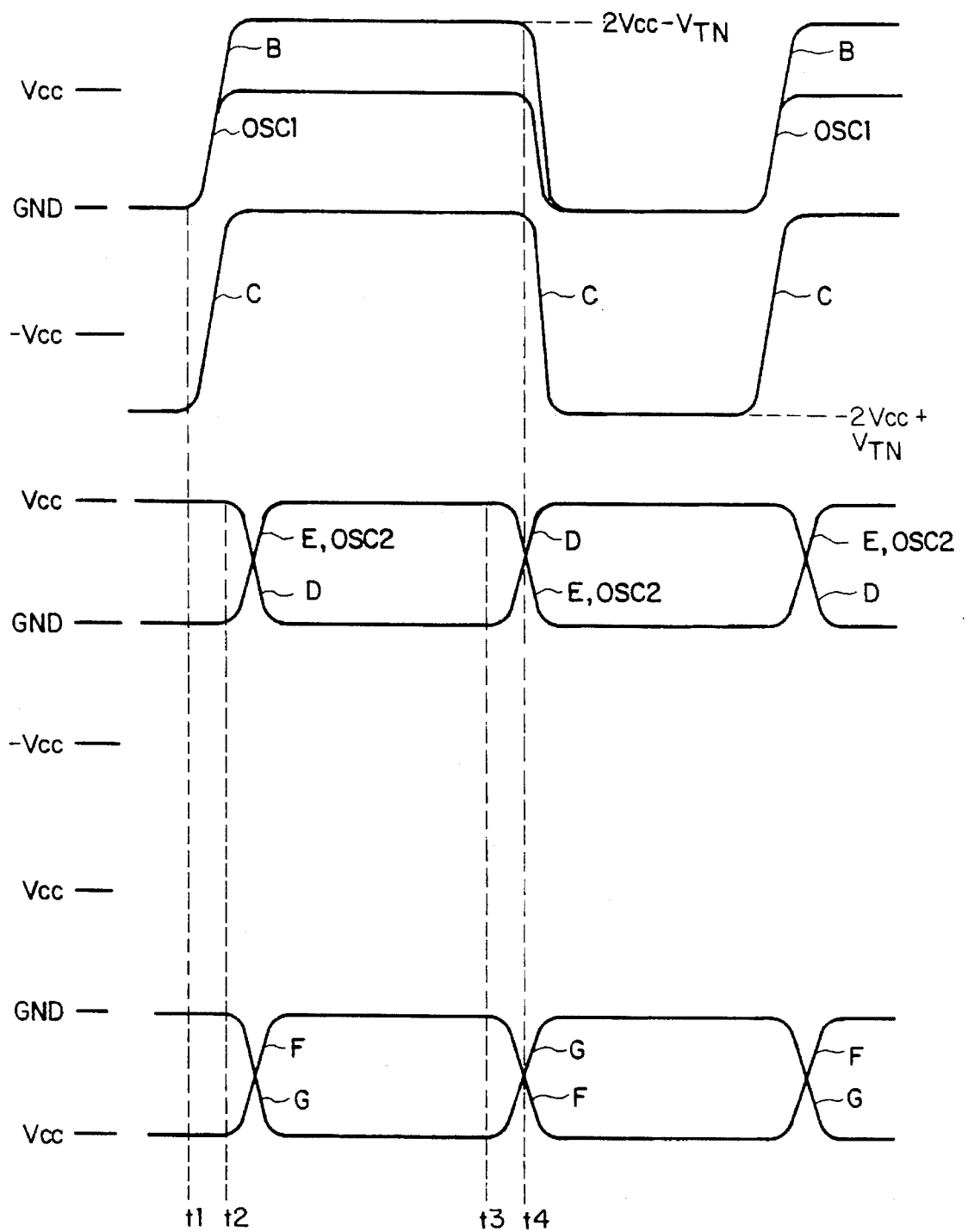
FIG. 2 is a waveform diagram showing voltage waveforms at major points of the voltage generator circuit shown in FIG. 1.

Each of the clock signals OSC1 and OSC2 oscillates between a ground voltage (GND) and a power supply voltage (Vcc) supplied to a DRAM having the present generator as a power voltage. However, the duty ratios and phases of the clock signals OSC1 and OSC2 are designed such that the Vcc level or high level period of the clock signal OSC1 is longer than that of the clock signal OSC2, as shown in FIG. 2. If desired, the high level periods of these clock signals OSC1 and OSC2 may be equal to each other.

The booster circuit 1 includes a high-voltage generator composed of a capacitor C1 and an n-type MOS transistor Q1, and a CMOS inverter composed of a p-type MOS transistor Q2 and an n-type MOS transistor Q3.

The low-potential generator circuit 2 includes a capacitor C3 connected between node E and node F, a capacitor C4 connected between node D and node G, a p-type MOS transistor Q5 with its source-drain path connected between GND ground and node G, and its gate connected to node F, and a p-type MOS transistor Q7 with its source-drain path connected between ground and node F and its gate connected node G.

The output circuit 3 includes a capacitor C2 connected between node B and node C, a p-type MOS transistor Q4 with its source-drain path connected between GND and node C and its gate connected to node G, and a p-type MOS transistor Q6 as the output transistor with its source-drain path connected between node F and the output terminal $V_{BB}$ and its gate connected to node C.

The operation of this embodiment is described below with reference to FIG. 2. The operation of the booster circuit 1 is described first. Before the time t1, the clock signal OSC1 is at GND level, and the output of the inverter INV3 is also at GND level. One electrode level of the capacitor C1 (node H) is then Vcc–VTN, where VTN is the threshold voltage of the n-type MOS transistor Q1. Because the output signal level of the inverter INV1 is Vcc, the n-type MOS transistor Q3 turns on and the output signal level of the booster circuit 1 (node B) is at the GND level potential.

Next, at the time t1 when the clock signal OSC1 goes to the Vcc level, the output of the inverter INV3 goes to Vcc and one electrode of the capacitor C1 (node H) goes up to 2Vcc–VTN. This is accompanied by the n-type MOS transistor Q1 turning off.

Because the p-type MOS transistor Q2 then turns on, the potential of the output B goes to 2Vcc–VTN.

After that, when the clock signal OSC1 returns to the GND level at the time t4, the output B goes back to GND level again.

By repeating the above-stated operation, the output B of the booster circuit 1 oscillates between GND level and 2Vcc–VTN and in phase with the clock signal OSC1.

Next, the low-potential generator circuit 2 is described in operation. When the clock signal OSC2 goes to the Vcc level at the time t2, the output of the inverter INV4 goes to Vcc. One electrode of the capacitor C3 (node F) has been at the –Vcc level due to charging prior to the time t2 and goes up to the GND level at the time t2. At the same time, the output signal level of the inverter INV2 (node D) goes to GND level. Before at the time t2, level of one electrode of the capacitor C4 (node G) is at GND level and then goes down to –Vcc at the time t2. The p-type MOS transistor Q7 is then on state because its gate level is at the –Vcc level and its source (node F) is at GND level. In contrast, p-type MOS transistor Q5 is off state because its gate (node F) is at GND level and its source (node G) is at the –Vcc level.

After that, when the clock signal OSC2 goes to GND level at the time t3, the output signal level of the inverter INV4 (node E) goes to GND. This is accompanied by one electrode of the capacitor C3 (node F) going from GND to the –Vcc level. At the same time, the output signal level of the inverter INV2 (node D) goes to the Vcc level.

This is accompanied by one electrode of the capacitor C4 (node G) going from the –Vcc to the GND level. The p-type MOS transistor Q7 is then in a off state because its gate level (node G) is at GND level and its source level (node F) is at the –Vcc level. However, the p-type MOS transistor Q5 is on state because its gate level (node F) is at the –Vcc level and its source level (node G) is at the GND level.

By repeating the above-stated operation, the output signal level of the low-voltage generator circuit 2 (node F) oscillates between GND and –Vcc levels and in phase with the clock signal OSC2.

Next, the output circuit 3 is described in operation. When the clock signal OSC1 goes to the Vcc level at the time t1, the output signal level of the booster circuit 1 (node B) goes to 2Vcc–VTN as described above. Before at the time t1, level of one electrode of the capacitor C2 (node C) is at a level of –2Vcc+VTN and then goes to GND level at the time t1.

Then, at the time t2 when the clock signal OSC2 goes up to the Vcc level, the node G goes down to the –Vcc level. The p-type MOS transistor Q4 is then turns on because its gate (node G) is at the –Vcc level and its source (node C) is at GND level. The p-type MOS transistor Q6 turns off because its gate (node C) is at GND level and its source (output $V_{BB}$) lies at a negative potential level.

The n-well substrate (hereinafter, substrate) of the p-type MOS transistor Q4 is supplied with the output signal of the booster circuit 1. The reason is as follows: When the output signal level of the booster circuit 1 (node B) first goes to a level of 2Vcc–VTN immediately after power-on, this is accompanied by the electrode of the capacitor C2 (node C) going to a potential level of 2Vcc–VTN. Substrates of other p-type transistors in this circuit are each supplied with Vcc. In Q4, however, if its substrate lies at a potential level of Vcc, an awkward situation arises in that its p-n junction is forward-biased because its source (p-type) is at 2Vcc–VTN and its substrate (n-type) is at Vcc. Thus, the substrate of Q4 is supplied with the output B to prevent the p-n junction becoming forward-biased immediately after power-on.

Next, at the time t3 when the clock signal OSC2 goes to GND level, the node G rises to the ground level and the p-type MOS transistor turns off.

At the time t4 when the clock signal OSC1 goes to GND level, the output signal level of the booster circuit 1 (node B) falls to GND level. This is accompanied by the electrode of the capacitor C2 (node C) pulling down to a level of –2Vcc+VTN. Because the node C is connected to the gate of the p-type MOS transistor Q6 which is the 10 output transistor of the output circuit 3, the gate of Q6 falls to a level of –2Vcc+VTN and Q6 turns on strongly. Therefore, from the output terminal VBB, the level of the node F, –Vcc, is delivered without change.

To deliver –Vcc from the output terminal VBB without change, and with VTP being the threshold voltage of the output transistor, which is a p-type MOS transistor, the threshold voltages VTN, VTP, and the supply voltage Vcc are set up such that the relationship of –2Vcc+VTN<–Vcc–VTP.

By repeating the above-stated operation, the external load (for example, the substrate of an n-type transistor) connected to the output terminal VBB is pulled down to a voltage of –Vcc.

In this embodiment, the output voltage is –Vcc and this ensures that the substrate connected to the output terminal is pulled down to a voltage level of –Vcc. In addition, because the gate level of the p-type MOS transistor Q6, which acts as the output transistor, is pulled down to –2Vcc+VTN, a very large potential difference arises between the source and drain and the current-driving capability of Q6 becomes large. Therefore, the substrate connected to the output terminal can be pulled down in a short time.

Figure 3:
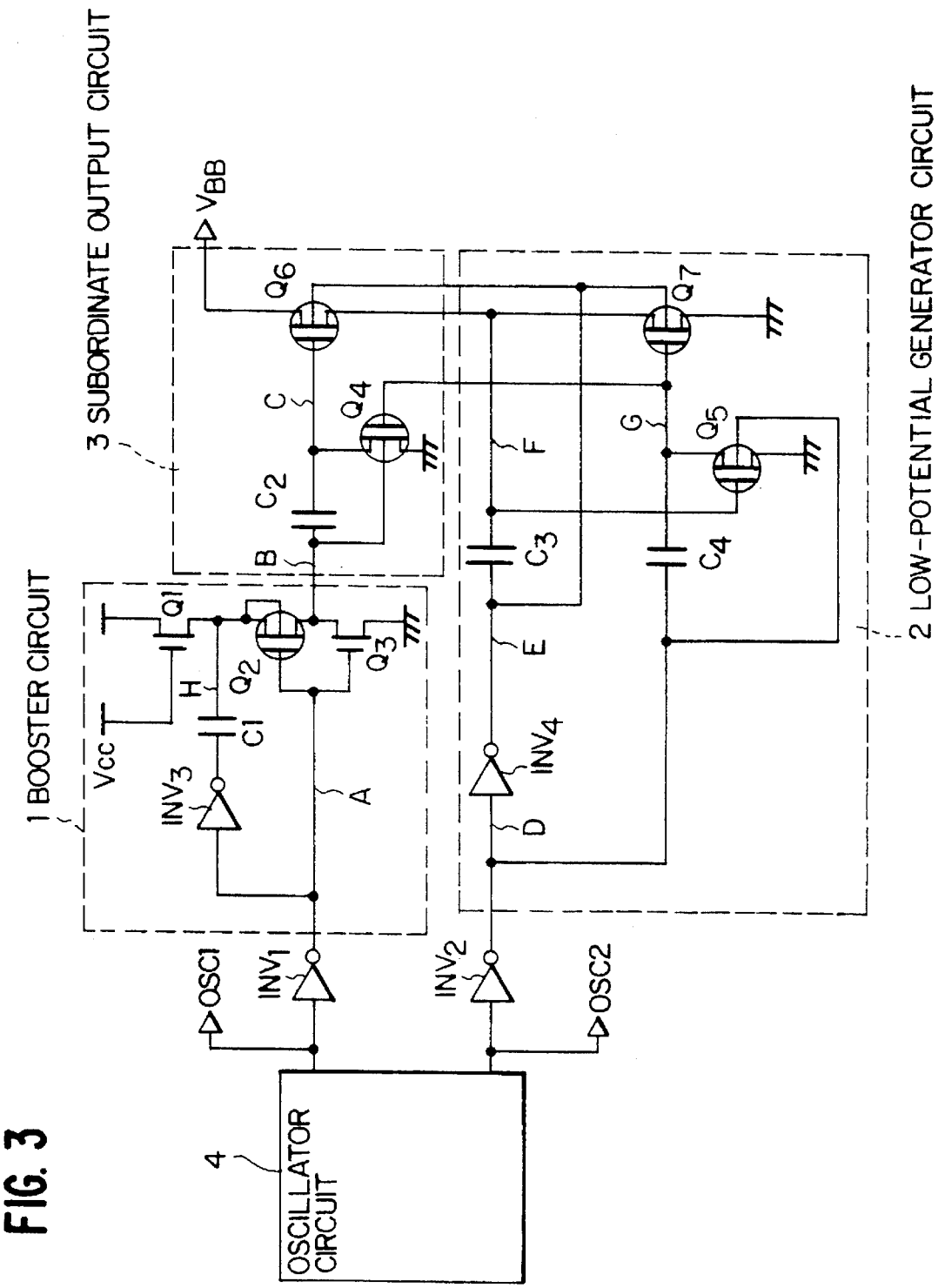
FIG. 3 is a circuit diagram of a voltage generator circuit according to a second embodiment of the present invention.

Next, the second embodiment of the invention is described with reference to FIG. 3. Parts common to the first embodiment shown in FIG. 1 are numbered the same way and their description is omitted. In this embodiment, substrates of transistors Q6 and Q7 are each supplied with an output signal of an inverter INV4, and the substrate of the transistor Q5 is supplied with the output signal of the inverter INV2. The reason for this arrangement is as follows: In the first embodiment, Vcc is applied to n-type substrates of transistors Q5, Q6, and Q7 as described above. However, sources (p-type) of these transistors fall to a potential of −Vcc. Therefore, when the GND level potential is applied to their gates, a reverse bias voltage of 2Vcc will be applied to these p-n junctions. In the embodiment here, the above-stated arrangement is taken to apply a small reverse bias voltage to p-n junctions between sources and substrates and thereby reduce the change of p-n junctions being damaged.

Specifically, at the time t4 shown in FIG. 2, the source of the transistor Q6 (output VBB) and the source of the transistor Q7 (node E) are each at a level of −Vcc. By applying the output signal of the inverter INV4 (node E), which then goes to GND level, to substrates, a smaller reverse bias voltage is present at p-n junctions between sources and substrates of both transistors. Similarly, the source of the transistor Q5 (node G) is at the −Vcc level at the time t2. The output D of the inverter INV2, which then goes to GND level, is applied to the substrate. Other operations are the same as in the first embodiment.

Although the invention has been described with reference to specific embodiments, this description is not meant to be construed in a limiting sense. Various modifications of the disclosed embodiments will become-apparent to persons skilled in the art upon reference to the description of the invention. It is therefore contemplated that the appended claims will cover any modifications or embodiments as fall within the true scope of the invention.

What is claimed is:

1. A voltage generator circuit comprising a first clock generator responding to a first clock signal oscillating with a first polarity and generating at a first output node a second clock signal with a second polarity opposite to said first polarity, a second clock generator responding to a third clock signal oscillating with said first polarity and generating at a second output node a fourth clock signal oscillating with said first polarity, and an output circuit responding to said second and fourth clock signals and generating at an output terminal thereof a bias voltage with said second polarity, said output circuit including an MOS transistor having a source-drain path connected between said output terminal and said first output node and a gate and a capacitance having a first electrode connected to said second output node to receive said fourth clock signal and a second electrode connected to the gate of said MOS transistor, the gate of said MOS transistor receives such a clock signal that is the same in phase and polarity with said second clock signal and has a voltage amplitude greater in absolute value than a voltage amplitude of said second clock signal.

2. A voltage generator circuit as claimed in claim 1, wherein said fourth clock signal has a voltage amplitude that is larger than a sum of a voltage amplitude of said second clock signal and a threshold voltage of said MOS transistor.

3. A voltage generator circuit as claimed in claim 1, further comprising an oscillator circuit generating said first and third clock signals.

4. A voltage generator circuit as claimed in claim 3, wherein said first and third clock signals have the same frequency as each other, said first clock signal having a high level period shorter than a high level period of said third clock signal.

5. A voltage circuit comprising a first clock generator responding to a first clock signal oscillating with a first polarity and generating a second clock signal with a second polarity opposite to said first polarity, a second clock generator responding to a third clock signal oscillating with said first polarity and generating a fourth clock signal oscillating with said first polarity and having a voltage amplitude greater in absolute value than an amplitude voltage of said second clock signal, and an output circuit responding to said second and fourth clock signals and generating at an output terminal thereof a bias voltage with said second polarity, wherein said first clock generator has a first MOS transistor of one conductivity type having a source-drain path connected between a first node and a supply terminal, a second MOS transistor of said one conductivity type having a source-drain path connected between an output thereof and said supply terminal, a first capacitor having one electrode supplied with an inverted signal of said first clock signal and the other electrode connected to the gate of said first MOS transistor and said output, a second capacitor having one electrode supplied with said first clock signal and the other electrode connected to said first node, and the second clock generator circuit has a booster circuit to generate at a second node a clock signal whose highest voltage is equal to a first supply voltage boosted and a CMOS inverter circuit placed between the output of said booster circuit and said supply terminal and taking said first clock signal as its input, and said output circuit has a third MOS transistor of said one conductivity type with its source-drain path connected between said output terminal and the output of said first clock generator circuit and its gate connected to the second node and a fourth MOS transistor of said one conductivity type with its source-drain path connected between said second node and said supply terminal and its gate connected to said first node and a third capacitance receiving at one electrode the output of said CMOS inverter and connected at the other electrode to said second node.

6. A voltage generator circuit comprising a negative clock generating means for generating a negative clock signal oscillating with a negative potential, a positive clock generation means to generate a positive clock signal oscillating with a positive potential, and an output means for providing the low level of said negative clock signal in response to said positive clock signal, wherein said output circuit has an MOS transistor having a source-drain path connected between the output terminal and a first node supplied with said negative clock signal and a gate connected to a second node, a capacitance receiving at one electrode said positive clock signal and connected at the other electrode to said second node, the voltage of said second node oscillates with said negative potential in phase with said negative clock signal and has a voltage amplitude greater in absolute value than a voltage amplitude of said negative clock signal.

* * * * *